United States Patent [19]

Kurihara

[11] 4,441,577

[45] Apr. 10, 1984

[54] DIRECTION-VARIABLE SPEAKER SYSTEM

[75] Inventor: Masaki Kurihara, Tokyo, Japan

[73] Assignee: Clarion Co., Ltd, Tokyo, Japan

[21] Appl. No.: 437,764

[22] Filed: Oct. 27, 1982

[30] Foreign Application Priority Data

Oct. 30, 1981 [JP] Japan .......................... 56-161238[U]

[51] Int. Cl.$^3$ .............................................. H05K 5/00

[52] U.S. Cl. .................................... 181/147; 181/141; 179/146 E; 381/86

[58] Field of Search ......................... 181/141, 143-147, 181/199; 381/86-90; 179/146 R, 146 E, 149, 150

[56] References Cited

U.S. PATENT DOCUMENTS 3,752,258 8/1973 Ishikawa ............................. 181/145

4,139,734 2/1979 Fincham .......................... 181/145 X 4,365,114 12/1982 Soma ............................... 181/144 X

*Primary Examiner*—Benjamin R. Fuller

*Attorney, Agent, or Firm*—Flynn, Thiel, Boutell & Tanis

[57] ABSTRACT

The direction-variable speaker system has first and second speaker cases containing speaker units for different reproduction bands, respectively, and an intermediate case interposed between those two speaker cases. The first speaker case and the intermediate case are connected by a first pivotal shaft pivotally of each other and are given tendency to pull each other. Between the first speaker system and the intermediate case is provided a rising angle setting mechanism including a first gear cam secured to one of these cases and a stopper member secured to the other for meshing engagement with the first gear cam. The second speaker case and the intermediate case are connected by second pivotal shaft pivotally of each other and are given tendency to pull each other. Between the intermediate case and the second speaker case is provided a twisting angle setting mechanism including second gear cam secured to the second speaker case concentrically of the second pivotal shaft and third gear cam secured to the intermediate case for meshing engagement with the second gear cam.

5 Claims, 8 Drawing Figures

DIRECTION-VARIABLE SPEAKER SYSTEM

BACKGROUND OF THE INVENTION

This invention relates to a direction-variable speaker system for car audio devices.

FIG. 1 shows one of conventional speaker system. In the Figure, the reference numeral 1 denotes a woofer and 2 designates a tweeter. The tweeter 2 is accompanied by an audio lens member 2*a* and is rigidly fixed on an edge portion of a cone 1*a* of the woofer 1 in upright state. The woofer 1 reproduces sounds in low frequency band while the tweeter 2 reproduces high frequency sound.

However, since the tweeter 2 is rigidly fixed on the edge of the cone 1*a* of the woofer 1 in upright state, there has been a problem. That is, it sometimes sounds too high in a position where high band sound pressure exists in remote positions like driver's seat or assistant's seat while it sounds low in the other position. This means that satisfactory stereophonic effect cannot be obtained. Further, cross modulation occurs because the cone 1*a* near the tweeter 2 vibrates due to carrier wave from the woofer 1 through the audio lenses 2*a*.

FIG. 2 shows another example of conventional speaker systems in which a tweeter 3 is mounted on the edge of the cone 1*a* of the woofer 1 so as to be variable only in its rising angle in the direction as shown by the arrow in this Figure. However, this system also has the same problem as the former example when it is used for a car radio to be mounted in a limited space. Further, since the tweeter 3 makes an obstacle on the woofer 1 to vary characteristic of the carrier from the woofer 1.

OBJECT OF THE INVENTION

The present invention has been made to overcome said problems in the prior art. To this end, speakers for high and low bands, respectively, are contained in different speaker cases, namely in a first and second speaker cases, respectively, and mechanisms for changing rising angle and twisting angle of the speakers are interposed between the first speaker case and the second speaker case, so that the speakers may be variable in their angles not only in rising amount but also in twisting amount.

SUMMARY OF THE INVENTION

In accordance with the present invention, there is provided a speaker system which comprises:

first and second speaker cases for containing speaker units for different reproduction bands, respectively;

intermediate case interposed between said first and second speaker cases;

first connecting means for pivotally connecting said first speaker case and said intermediate case;

rising angle setting means for raising said intermediate case with respect to said first speaker cases;

second connecting means for pivotally connecting said second speaker case and said intermediate case; and twisting angle setting means for twisting said second speaker case with respect to said intermediate case.

BRIEF DESCRIPTION OF THE DRAWINGS

FIG. 3 to 8 show an embodiment of the direction-variable speaker system according to the present invention, in which: FIG. 3 is a perspective view; FIG. 4 is a perspective view with a part being cut off to show the main portion; FIG. 5 is a perspective view illustrating the state that the second speaker case is raised up to a given angle; FIG. 6 is a perspective view illustrating the state that the second speaker is raised up to said angle as shown in FIG. 5 and also twisted; FIG. 7 is a plan view showing the state that two sets of the direction-variable speaker systems are mounted in a car; and FIG. 8 is a perspective view showing the state that the system are mounted on a side wall of a parcel carrier area of a van.

DETAILED DESCRIPTION OF THE PREFERRED EMBODIMENTS

Figure 1:
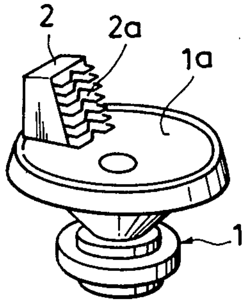
FIG. 1 PRIOR ART
FIG. 1 is a perspective view of a conventional speaker system.
Figure 2:
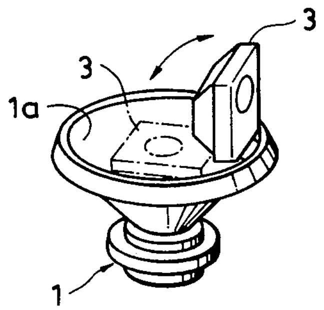
FIG. 2 PRIOR ART
FIG. 2 is a perspective view of another conventional speaker system.

The present invention will now be described in detail by way of the preferred embodiments illustrated in the drawings.

Figure 3:
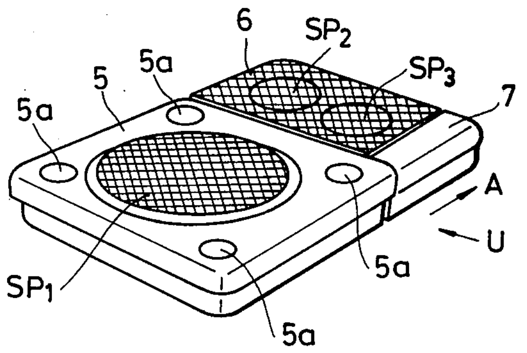
Figure 4:
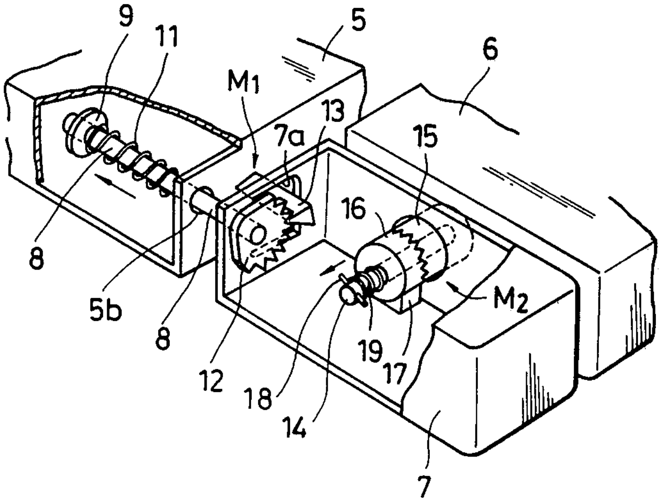

FIGS. 3 and 4 show an embodiment according to the present invention.

The reference numeral 5 and 6 in these Figures designate first and second speaker cases for containing speakers for different reproduction bands, respectively. The first speaker case 5, for example, contains a woofer $SP_1$ for low band reproduction while the second speaker case 6 contains a tweeter $SP_2$ and a scoker $SP_3$ for higher band reproduction. Between the first speaker case 5 and the second speaker case 6 is interposed an intermediate case 7 which is made independently from the speaker cases 5 and 6.

The first speaker case 5 and the intermediate case 7 are connected by a rising angle setting mechanism $M_1$. The rising angle setting mechanism $M_1$ comprises a first pivotal shaft 8 extending from the intermediate case 7 to the interior of the first speaker case 5 in a manner rigidly secured to the intermediate case 7 and rotatably inserted in a hole 5*b* of a wall plate of the first speaker case 5, a flange 9 rigidly secured to an end portion of the first pivotal shaft 8 remote from the intermediate case 7, a coil spring 11 provided on the first pivotal shaft 8 and between the flange 9 and said wall of the first speaker case 5. The first speaker case 5 and the intermediate case 7 are pivotal with respect to each other and tend to pull each other due to expansion force of the coil spring 11. Further, a first gear cam 12 is secured on inner side of a wall of the intermediate case 7 opposed to the first speaker case 5 concentrically of the first pivotal shaft 8. A stopper member 13 projects from the first speaker case 5 and extends in the interior of the intermediate case 7 through an opening 7*a* for engaging with the first gear cam 12.

On the other hand, the intermediate case 7 and the seccond speaker case i6 are connected by a twisting angle setting mechanism $M_2$. The twisting angle setting mechanism $M_2$ comprises a second pivotal shaft 14 rigidly secured with one end thereof to the second speaker case 6 and extending in the interior of the intermediate case 7 pivotally of the same, a cylindrical second gear cam 15 secured to the second speaker case 6 concentrically of the second pivotal shaft 14, a third gear cam 16 secured to the intermediate case 7 through a bracket 17, for example, for meshing engagement with the second gear cam 15. The second pivotal shaft 14 is rotatably inserted in the central bore of the third gear cam 16. A pin 18 is rigidly secured to the tip of the second pivotal shaft 14 remote from the second speaker case 6. A coil spring is provided on the second pivotal shaft 14 and between the pin 18 and the end wall of the third gear cam 16. Due to expansion force of the coil spring 19 the second speaker case 6 and the intermediate case 7 are pivotal each other and tend to pull each other while the second and third gear cams 15 and 16 tend to mesh each other.

The reference numeral 5*a* designates bolt holes permitting the first speaker case 5 to be secured on a rear parcel tray area of a car with bolts as will be described later. That is, in usual, the first speaker case 5 is rigidly secured while the second speaker 6 is mounted variably in its rising and twisting angles.

Next, function of the speaker system will be described referring to FIGS. 5 to 8.

Figure 5:
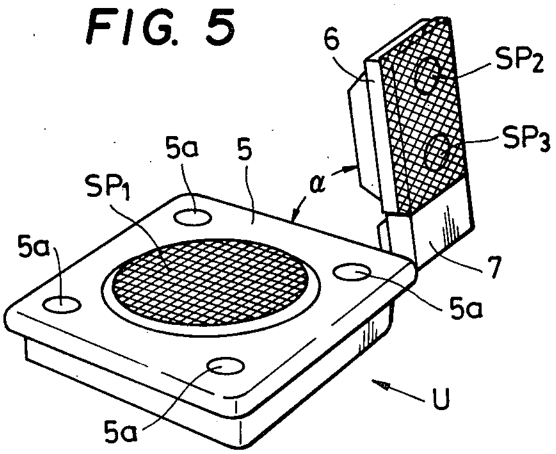
Figure 6:
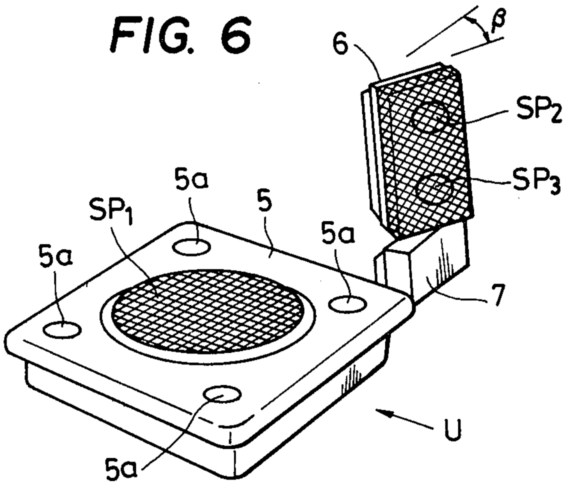
Figure 7:
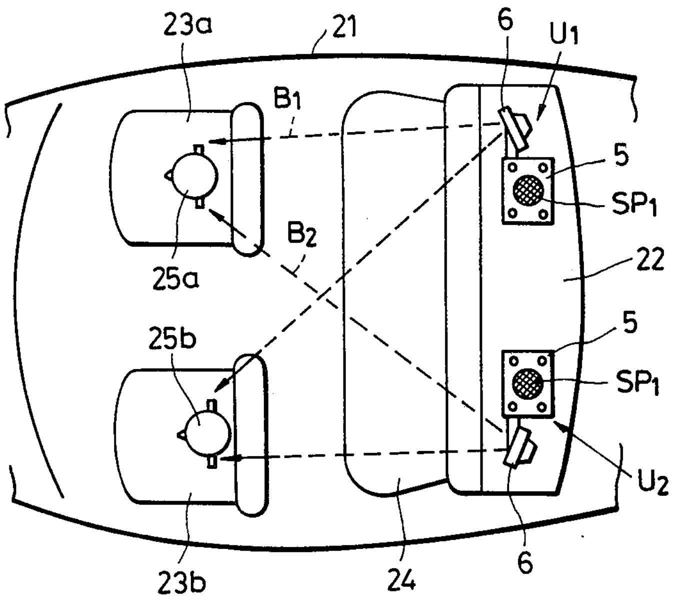

Assume now that the first speaker case 5 is rigidly secured to a rear parcel tray zone 22 of a car 21 with bolts as shown in FIG. 7. To raise the second speaker case 6 $\alpha$ degrees from the state of FIG. 3, the rising angle setting mechanism $M_1$ should be actuated as follows: grip the second speaker case 6 or the intermediate case 7; pull it in the arrow A direction of FIG. 3 against the elastic force of the coil spring 11 until the first gear cam 12 disengages from the stopper member 13; rotate the second speaker case 6 or the intermediate case 7 $\alpha$ degrees as it is in said sufficiently pulled position; and release the pulling force. Then, the intermediate case 7 is pulled toward the first speaker case 5 due to the revival force of the coil spring 11 and the stopper member 13 engages the first gear cam 12, again, keeping the second speaker case 6 $\alpha$ degrees raised as shown in FIG. 5. Next, to twist the second speaker case 6 $\beta$ degrees as it is in the $\alpha$ degrees raised state, the twisting angle setting mechanism $M_2$ is operated as follows: grip the second speaker case 6 and rotate it $\beta$ degrees. With this operation, the second gear cam 15 rotates in click manner with respect to the third gear cam 16 while keeping engagement with the third gear cam 16. Therefore, the second speaker case 6 maintains $\beta$ degrees twisted state also after the grip is released after $\beta$ degrees rotation.

Direction of reproduced sounds can be therefore controlled as desired.

In FIG. 7, two sets of direction-variable speaker systems U1 and U2 are mounted in a rear parcel tray area of the car 21. In this Figure, the reference numeral 23*a* refers to a driver's seat, 23*b* to an assistant's seat, 24 to rear seats, and 25*a* and 25*b* to riders (listners), respectively. The second speaker cases 6 of the two-direction-variable speaker system U1 and U2 are raised and inwardly twisted with desired angles. Now considering about the rider 25*a* in the driver's seat 23*a*, reproduction sound B1 which is relatively small diagonally reaches through relatively short distance from the left speaker system U1 while high band reproduction sound B2 which is relatively large straightly reaches through relatively long distance from the right speaker system U2. Therefore, high band reproduction sounds B1 and B2 from the speaker systems U1 and U2 come to be substantially equal in their sound pressure, leading to increase of stereophonic effect. The sounds B1 and B2 reach the rider 25*b* in the assistant's seat 23*b* in the contrary manner but substantially same result is obtained.

Angles of the second speaker cases 6 may be controlled in accordance with size and shape of a car room so as to equalize right and left sounds received at the individual seats.

Figure 8:
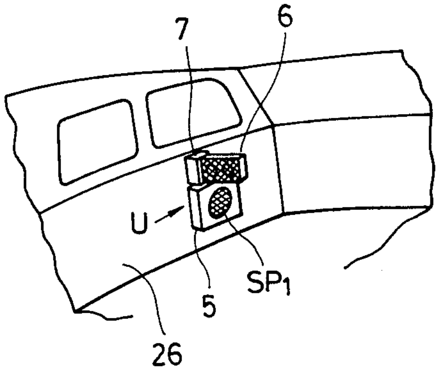

FIG. 8 shows one of the speaker systems which are mounted on side walls of parcel carrier area of a van. In this case, also, by raising and twisting the second speaker 6 given angles, respectively, it is possible to give listners in the driver's seat and the assistant's seat direct high band sounds, thereby improving high band deterioration and leading to increase of stereophonic effect.

As described in the above, the speaker system according to the present invention is so constructed that the speakers for different reproduction bands, namely for high and low bands, are contained in the first speaker case and the second speaker case, respectively, and the rising angle setting mechanism and twisting angle setting mechanism are interposed between the first speaker case and the second speaker case to vary not only rising angle but also twisting angle of one of the speakers with respect to the other. Therefore, paticularly when the speaker system is used in a limited space like a car room, satisfactorily even stereophonic effect can be obtained either in the driver's seat or in the assistant's seat by determining said angles in accordance with size and shape of the car room. Further, since the tweeter, for example, for high band reproduction can be raised at a side position of the woofer, cross modulation distortion due to carrier from the woofer can extremely be reduced.

I claim:

1. Speaker system which comprsies:

first and second speaker cases for containing speaker units for different reproduction bands, respectively;

intermediate case interposed between said first and second speaker cases;

first connecting means for pivotally connecting said first speaker case and said intermediate case;

rising angle setting means for raising said intermediate case with respect to said first speaker case;

second connecting means for pivotally connecting said second speaker case and said intermediate case; and twisting angle setting means for twisting said second speaker case with respect to said intermediate case.

2. Speaker system according to claim 1 wherein said first connecting means includes a first pivotal shaft penetrating said first speaker case and said intermediate case and a spring for giving said first speaker case and said intermediate case tendency to pull each other, and said rising angle setting means comprises a first gear cam provided on said first pivotal shaft and a stopper member for meshing engagement with said first gear cam.

3. Speaker system according to claim 2 wherein said second connecting means includes a second pivotal shaft penetrating said second speaker case and said intermediate case and a second spring for giving said second speaker case and said intermediate case tendency to pull each other, and said twisting angle setting means comprises a second gear cam provided on said second speaker case concentrically of said second pivotal shaft and a third gear cam provided in said intermediate case for meshing engagement with said second gear cam.

4. Speaker system according to claim 1 wherein said first speaker case is rigidly secured to a rear parcel tray of an automobile.

5. Speaker system according to claim 1 wherein the speaker unit contained in said first speaker case is for low band reproduction and the speaker unit contained in said second speaker case is for high band reproduction.

* * * * *